United States Patent [19]
Gross, Jr.

[11] Patent Number: 5,959,564
[45] Date of Patent: Sep. 28, 1999

[54] BROKEN THERMOMETER CODE AND COMPARATOR ERROR CORRECTION BY PSEUDO MAJORITY GATE DECODING IN ANALOG-TO-DIGITAL CONVERTERS

[75] Inventor: George Francis Gross, Jr., Fleetwood, Pa.

[73] Assignee: Lucent Technologies Inc., Murray Hill, N.J.

[21] Appl. No.: 08/992,019

[22] Filed: Dec. 17, 1997

[51] Int. Cl.$^6$ .................................................. H03M 1/36
[52] U.S. Cl. .......................................... 341/160; 341/118
[58] Field of Search .................................. 341/118, 159, 341/160

[56] References Cited

U.S. PATENT DOCUMENTS

| | | | |
|---|---|---|---|
| 4,644,322 | 2/1987 | Fujita | 341/160 |
| 5,072,221 | 12/1991 | Schmidt | 341/159 |
| 5,382,955 | 1/1995 | Knierim | 341/64 |
| 5,420,587 | 5/1995 | Michel | 341/156 |
| 5,511,222 | 4/1996 | Shiba et al. | 395/800 |
| 5,781,132 | 7/1998 | Lewyn | 341/159 |

OTHER PUBLICATIONS

Patent No. 4,870,417, filed on Feb. 12, 1988 and issued on Sep. 26, 1989 to van de Plassche et al.
Patent No. 5,243,347, filed on Sep. 28, 1992 and issued on Sep. 7, 1993 To Jackson et al.
Patent No. 4,774,498, filed on Mar. 9, 1987 and issued on Sep. 27, 1988 to Traa.
Patent No. 5,221,926, filed on Jul. 1, 1992 and issued on Jun. 22, 1993 to Jackson.
Patent No. 4,851,845, filed on Apr. 18, 1988 and issued on Jul. 25, 1989 to Hotta et al.
Patent No. 5,283,580, filed on Sep. 28, 1992 and issued Feb. 1, 1994 to Brooks et al.
Patent No. 4,983,968, filed on Oct. 10, 1989 and issued on Jan. 8, 1991 to Nguyen et al.
Patent No. 4,897,657, filed on Jun. 13, 1988 and issued on Jan. 30, 1990 to Brubaker.
Patent No. 4,712,087, filed on Feb. 9, 1987 and issued on Dec. 8, 1987 to Traa.
Patent No. 5,029,305, filed on Dec. 21, 1988 and issued on Jul. 2, 1991 to Richardson.

*Primary Examiner*—Marc S. Hoff
*Attorney, Agent, or Firm*—David L. Smith

[57] ABSTRACT

There is disclosed, a converter for converting an input signal from one form to another includes a generator circuit for generating as a thermometer code a plurality of binary signals from the input signal. The converter includes one or more pseudo-majority gate circuits for correcting a broken thermometer code to be a corrected thermometer code. The corrected thermometer code is decoded to provide a digital code corresponding to the input signal. There may be more than one stage of pseudo-majority gate correction.

12 Claims, 2 Drawing Sheets

BROKEN THERMOMETER CODE AND COMPARATOR ERROR CORRECTION BY PSEUDO MAJORITY GATE DECODING IN ANALOG-TO-DIGITAL CONVERTERS

FIELD OF THE INVENTION

This invention relates to correcting errors in digital codes and in particular to correcting errors in thermometer type digital codes by employing pseudo-majority gate decoding.

BACKGROUND OF THE INVENTION

ADCs are used to convert an analog signal to a digitally coded signal. ADCs span a spectrum of designs which can, with the appropriate circuitry, range from a successive approximation type that generally requires one clock cycle per bit of resolution on one end of the spectrum, to parallel flash types, employing multiple comparators, that generally require one clock cycle for all bits of resolution conversion at the other end of the spectrum.

Flash analog-to-digital converters include comparators, each of which receives a representation of the analog input signal and a predetermined reference voltage. The comaparator outputs ideally collectively form a "thermometer code" with all outputs below a particular output being of one state, and all outputs above the particular output being of another state. The transition from one state in the ideal thermometer code to another state is decoded to generate an output that is a digital representation corresponding to the analog input signal to the converter.

Comparators employed in such converters may be subject to offset errors, noise spikes, or stuck-at-particular-state faults, resulting in a thermometer code with more than one transition from one state to another. Multiple transitions from one state to another in a thermometer code is commonly referred to as bubbles in a thermometer code. Having bubbles in the thermometer code results in multiple apparent transitions, and conversion of the thernometer code to a single, unique, digital representation of the applied analog input signal becomes impossible.

A simple majority gate technique has been used to correct errors in thermometer codes that were not ideal. In the simple majority gate technique, an odd number of bits in the thermometer code, typically centered at the bit being evaluated, are considered in determining whether a bit is correct or incorrect. For example, to determine whether a particular bit is correct using a three input majority gate technique, that bit as well as the bit above and the bit below in the thermometer code are considered. The state of two out of three bits constitutes a majority. Thus, if two of the three bits, which are inputs to a majority gate circuit are logic one, then the correct output state for the particular bit is also a logic one. Correspondingly, if two of the three inputs are logic zero, then the correct output state for the particular bit is a zero.

While the simple majority gate technique corrects for some errors, and generally the accuracy of the correction is improved by considering an increased number of bits, there remain some thermometer code errors that are not properly corrected by simple majority gate techniques. What is needed is a technique to correct for broken thermometer codes that provides better performance than a simple majority gate technique.

SUMMARY OF THE INVENTION

In accordance with the invention, a converter for converting an input signal from one form to another includes a generator circuit for generating as a thermometer code a plurality of binary signals from the input signal. The converter includes one or more pseudo-majority gate circuits for correcting a broken thermometer code to be a corrected thermometer code. The corrected thermometer code is decoded to provide a digital code corresponding to the input signal. There may be more than one stage of pseudo-majority gate correction.

DETAILED DESCRIPTION

Figure 1:
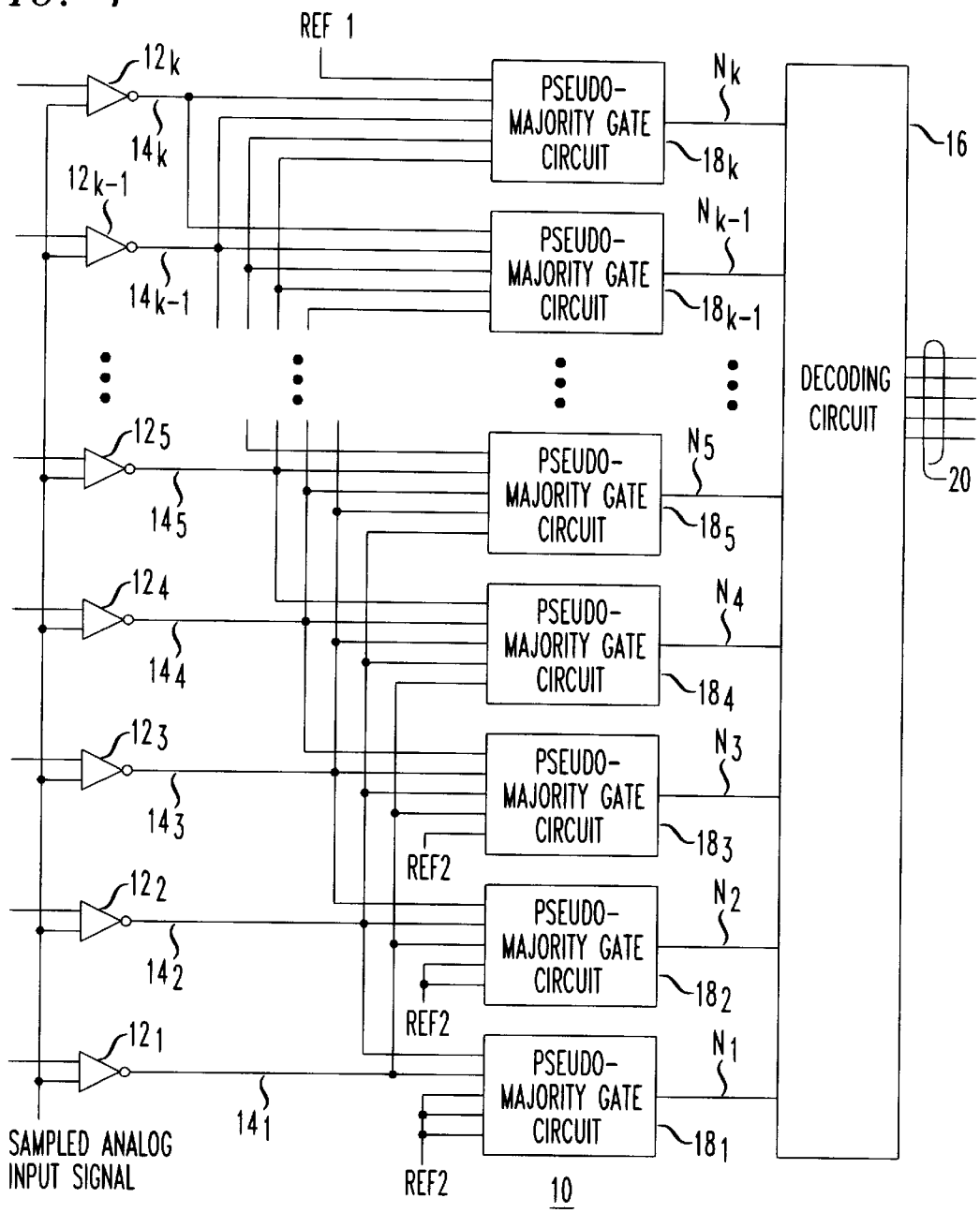
FIG. 1 is a schematic diagram of a portion of an analog-to-digital converter in accordance with the present invention.

A schematic diagram of a portion of an ADC in accordance with an illustrative embodiment of the invention is shown in FIG. 1. The ADC may be a current or voltage driven converter 10 that is single ended or fully differential, and may or may not include subranging. The converter may be a stand-alone converter or may be a portion of an integrated circuit such as a microprocessor, microcontroller or digital signal processor. Converter 10 includes comparators $12_1$ through $12_k$, where k is the number of comparators. Each comparator provides a respective output $14_1$ through $14_k$ that takes on a binary state of a logic high or a logic low. Collectively, the outputs 14 represent a thermometer code. The comparator outputs in a lower portion of the thermometer code take on a first logic state, such as a logic zero, and the comparator outputs in an upper portion of the thermometer code take on a second logic state, such as a logic one.

Ideally, there is no more than one transition in the thermometer code from the first logic state to the second logic state. The transition, which is indicative of the analog input signal, is detected and translated into a digital code by decoding circuit 16. However, due to such factors as comparator offset errors, noise spikes, and stuck-at-particular state fault, there is often more than one transition in the thermometer code from a first state to a second state. Having more than one transition in the thermometer code is referred to as a broken thermometer code, with the multiple transitions being bubbles. To correct or compensate for the broken thermometer code, and thereby determine where the single transition should occur in the thermometer code, a plurality of pseudo-majority gate circuits 18 are interposed between the comparators 12 and decoding circuit 16. Pseudo-majority gate circuits 18 receive as inputs selected ones of the comparator outputs 14 and provide respective outputs to decoding circuit 16. The number of pseudo-majority gate circuits 18 corresponds in number to the number of comparators.

Figure 2:
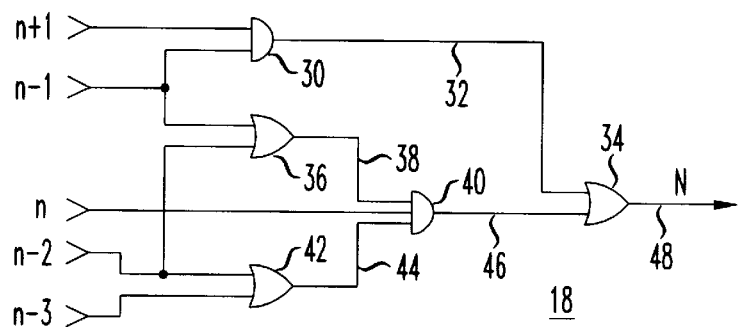
FIG. 2 is a schematic diagram of a pseudo-majority gate circuit useful in the analog-to-digital converter of FIG. 1.

A schematic diagram of a pseudo-majority gate circuit 18 in accordance with the invention is shown in FIG. 2. Each of pseudo-majority gate circuits 18 may be identical. Each output 14 may be provided as an input to more than one of pseudo-majority gate circuits 18. Circuit 18 has five inputs denoted n+1, n, n−1, n−2, and n−3, as well as an output denoted N. Input n may represent any output 14 in the thermometer code. Input n is the output 14 being evaluated by circuit 18. Input n+1 represents the output 14 in the thermometer code "above" (as illustrated in FIG. 1) the $n^{th}$ input, and corresponds to a larger digital representation of the analog input signal. When the $n^{th}$ input is sufficiently close to the top of the thermometer code(as illustrated in FIG. 1), all inputs to circuit 18 above the $n^{ht}$ input for which there are no thermometer codes are tied to a first reference, REF1, such as a logic low. Similarly, inputs n−1, n−2 and n−3 represent outputs 14 in the thermometer code "below" (as illustrated in FIG. 1) the $n^{th}$ input and correspond to a smaller digital representation of the analog input signal. When input n is sufficiently close to the bottom of the thermometer code, all inputs below n for which there are no thermometer code outputs are tied to a second reference, REF2, such as a logic high. One skilled in the art could simplify the pseudo-majority gate circuits 18 at the top and bottom of the thermometer code, rather than tie selected ones of the inputs to a predetermined logic state.

One example of how a pseudo-majority gate circuit would be coupled to the comparator outputs would be for the evaluation of output $14_4$ by pseudo-majority gate circuit $18_4$. Pseudo-majority gate circuit $18_4$ has input n coupled to output $14_4$; input n+1 coupled to output $14_5$; input n−1 coupled to output $14_3$; input n−2 coupled to output $14_2$; and input n−3 coupled to output $14_1$.

As illustrated in FIG. 2, inputs n+1 and n−1 to pseudo majority gate circuit 18 are provided as inputs to AND gate 30. AND gate 30 output 32 provides a first input to OR gate 34. Inputs n−1 and n−2 to pseudo-majority gate circuit 18 are provided as inputs to OR gate 36. OR gate 36 output 38 provides a first input to AND gate 40. Inputs n−2 and n−3 to pseudo-majority gate circuit 18 are provided as inputs to OR gate 42. OR gate 42 output 44 provides a second input to AND gate 40. Input n to pseudo-majority gate circuit 18 provides a third input to AND gate 40. And gate 40 output 46 provides a second input to OR gate 34. The logic elements comprising pseudo-majority gate circuit 18 logically combine the inputs to produce OR gate 34 output 48. Or gate 34 output 48 is the corrected output, denoted N, of pseudo-majority gate circuit 18 for input n. The corrected outputs N are collectively a corrected thermometer code which may be decoded by decoding circuit 16 to provide a digital output 20 of an appropriate number of bits. The output N of pseudo-majority gate circuit 18 for all combinations of the five input is shown in Table I.

TABLE I

| n + 1 | n | n − 1 | n − 2 | n − 3 | N |
|---|---|---|---|---|---|
| 0 | 0 | 0 | 0 | 0 | 0 |
| 0 | 0 | 0 | 0 | 1 | 0 |
| 0 | 0 | 0 | 1 | 0 | 0 |
| 0 | 0 | 0 | 1 | 1 | 0 |
| 0 | 0 | 1 | 0 | 0 | 0 |
| 0 | 0 | 1 | 0 | 1 | 0 |
| 0 | 0 | 1 | 1 | 0 | 0 |
| 0 | 0 | 1 | 1 | 1 | 0 |
| 0 | 1 | 0 | 0 | 0 | 0 |
| 0 | 1 | 0 | 0 | 1 | 0 |
| 0 | 1 | 0 | 1 | 0 | 1 |
| 0 | 1 | 0 | 1 | 1 | 1 |
| 0 | 1 | 1 | 0 | 0 | 0 |
| 0 | 1 | 1 | 0 | 1 | 1 |
| 0 | 1 | 1 | 1 | 0 | 1 |
| 0 | 1 | 1 | 1 | 1 | 1 |
| 1 | 0 | 0 | 0 | 0 | 0 |
| 1 | 0 | 0 | 0 | 1 | 0 |
| 1 | 0 | 0 | 1 | 0 | 0 |
| 1 | 0 | 0 | 1 | 1 | 0 |
| 1 | 0 | 1 | 0 | 0 | 1 |

TABLE I-continued

| n + 1 | n | n − 1 | n − 2 | n − 3 | N |
|---|---|---|---|---|---|
| 1 | 0 | 1 | 0 | 1 | 1 |
| 1 | 0 | 1 | 1 | 0 | 1 |
| 1 | 0 | 1 | 1 | 1 | 1 |
| 1 | 1 | 0 | 0 | 0 | 0 |
| 1 | 1 | 0 | 0 | 1 | 0 |
| 1 | 1 | 0 | 1 | 0 | 1 |
| 1 | 1 | 0 | 1 | 1 | 1 |
| 1 | 1 | 1 | 0 | 0 | 1 |
| 1 | 1 | 1 | 0 | 1 | 1 |
| 1 | 1 | 1 | 1 | 0 | 1 |
| 1 | 1 | 1 | 1 | 1 | 1 |

Figure 3:
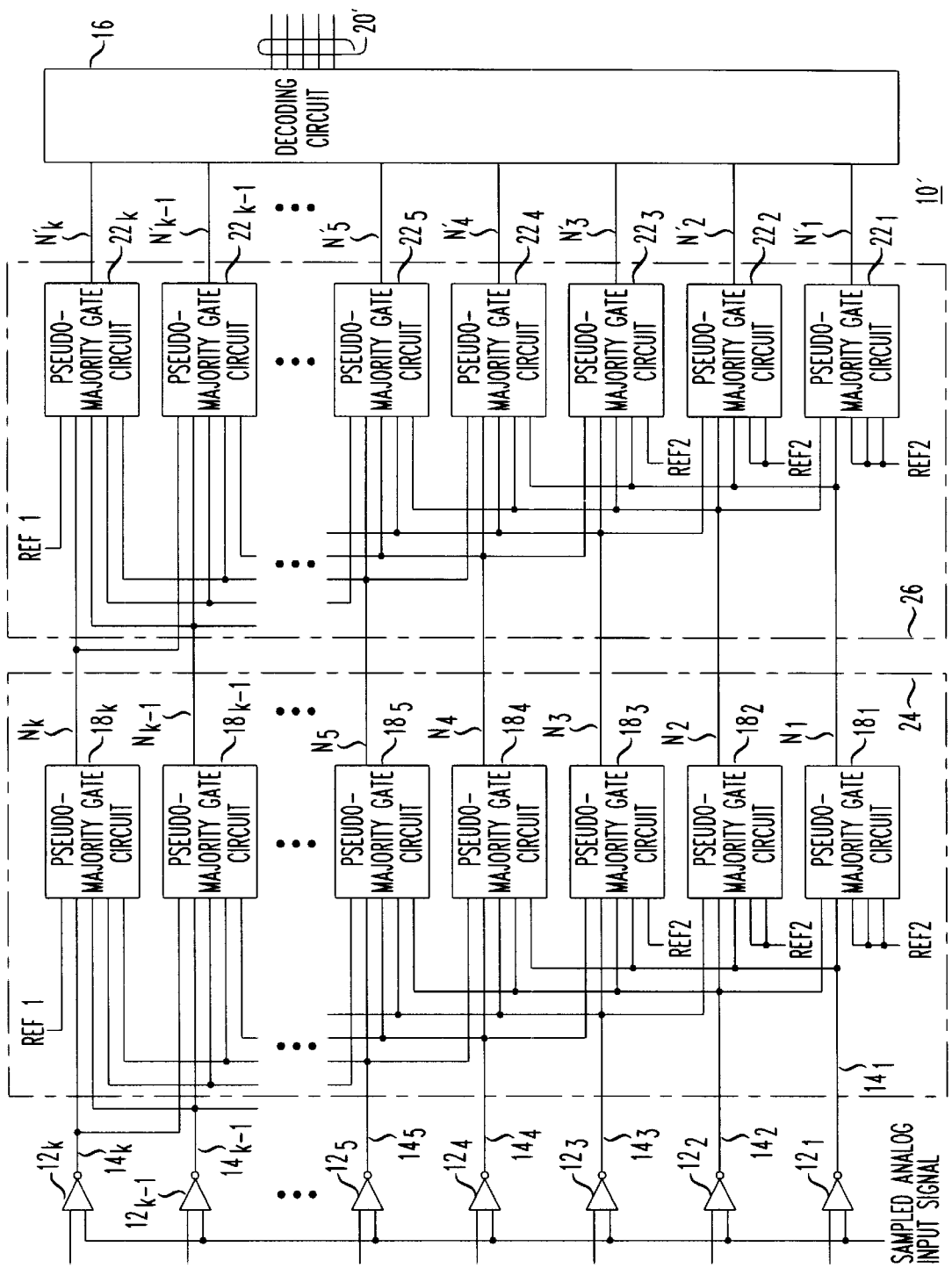
FIG. 3 is a schematic diagram of a portion of an analog-to-digital converter illustrating an alternative embodiment of the invention.

One skilled in the art could develop a conjugate circuit wherein the asymmetry exhibited by the inputs is also reversed. While the single stage of pseudo-majority gate correction described above correts many broken thermometer code errors, additional error correction may be achieved by cascading a second stage of pseudo-majority gate circuits 22 as illustrated in an alternate embodiment converter 10' shown in FIG. 3. In converter 10', pseudo-majority gate circuits 22 may be identical to pseudo-majority gate circuits 18 described above. The pseudo-majority gate circuit 18 collectively define a first stage 24 of pseudo-majority gate circuits. The corrected output N from first stage 24 provide the inputs to pseudo-majority gate circuits 22 of the second stage 26, which provide second stage corrected outputs $N_1'$ through $N_k'$. The second stage corrected outputs N' are provided to decoding circuit 16 for conversion to a digital code 20' of an appropriate number of bits. When pseudo-majority gate circuits 22 are identical to pseudo-majority gate circuits 18, Table I also may be used to determine the second stage corrected outputs, given the first stage corrected outputs from pseudo-majority gate circuits 18.

While the invention has been described as correcting errors in digital codes, such as a broken thermometer code in an analog-to-digital converter, the invention is not limited thereto. The invention may, for example, be used to provide error correction of other binary codes without regard to how they are generated, such as binary data transmitted over a channel. Furthermore, while the invention has been described as providing at least two stages of pseudo-majority gate circuits, additional stages of pseudo-majority gate circuits could be utilized for additional error correction. In addition, one skilled in the art could develop a conjugate pseudo-majority gate circuit wherein the asymmetry exhibited by the inputs is reversed and the logic sense of the binary code is also reversed.

What is claimed is:

1. Apparatus for correcting errors in thermometer codes, comprising:
   a circuit adapted to generate a plurality of binary output signals;
   at least one pseudo-majority-gate circuit coupled to receive as inputs selected ones of the binary output signals as first, second, third, fourth, and fifth inputs, the at least one pseudo majority gate circuit providing a corrected output that takes on a first logic state when either the first and third inputs are logic high, or when either the third and fourth inputs are a logic high and the second input is a logic high and either the fourth or fifth inputs are a logic high, and the at least one pseudo-majority gate circuit providing a corrected output that takes on a second state otherwise; and
   a decoding circuit adapted to receive as an input the corrected output from the at least one pseudo majority gate circuit, the decoding circuit adapted to decode the input to provide a digitally encoded signal.

2. Apparatus as recited in claim 1, wherein there are a predetermined number of binary output signals, the at least one pseudo-majority gate circuit comprising a number of pseudo- majority gate circuits corresponding to the predetermined number of binary output signals.

3. A converter as recited in claim 1, wherein at least one of the inputs to tile at least one pseudo-majority gate circuit is coupled to a predetermined logic level.

4. A converter as recited in claim 1, wherein the corrected output from the at least one pseudo- majority gate circuit corresponds to the second input to the at least one pseudo-majority gate circuit.

5. Apparatus as recited in claim 1, wherein the apparatus is a converter adapted to receive an analog input signal.

6. A converter for converting a signal from one from to another, comprising:
  a generator circuit adapted to receive an analog input signal and generate a plurality of binary output signals therefrom;
  a plurality of pseudo-majority-gate circuits coupled to the generator circuit, the pseudo-majority gate circuits corresponding in number to the plurality of binary output signals, the pseudo-majority-gate circuits each coupled to receive as input signals selected ones of the binary output signals as first, second, third, fourth, and fifth input signals, each of the pseudo majority gate circuits providing a corrected output that takes on a first logic state when either the first and third input signals are logic high, or when either the third and fourth input signals are a logic high and the second input signal is a logic high and either the fourth or fifth input signals are a logic high, and the pseudo-majority gate circuits providing a corrected output that takes on a second state otherwise; and
  a decoding circuit adapted to receive as inputs the corrected output from the pseudo-majority gate circuits, the decoding circuit adapted to decode the inputs to provide a digitally encoded signal.

7. A converter as recited in clam 6, wherein the converter is fabricated in an integrated circuit.

8. A converter as recited in claim 7, wherein the integrated circuit is a digital signal processor.

9. A converter for converting a signal from one from to another, comprising:
  a generator circuit adapted to receive an analog input signal and generate a plurality of binary output signals therefrom;
  a first plurality of pseudo-majority-gate circuits coupled to the generator circuit, the first plurality of pseudo-majority gate circuits corresponding in number to the plurality of binary output signals, the first plurality of pseudo-majority-gate circuits each coupled to receive as input signals selected ones of the binary output signals as first, second, third, fourth, and fifth input signals, each of the first plurality of pseudo-majority gate circuits providing a corrected output that takes on a first logic state when either the first and third input signals are logic high, or when either the third and fourth input signals are a logic high and the second input signal is a logic high and either the fourth or fifth input signals are a logic high, and the first plurality of pseudo-majority gate circuits providing a corrected output that takes on a second state otherwise;
  a second plurality of pseudo-majority-gate circuits coupled to the first plurality of pseudo majority gate circuits, the second plurality of pseudo-majority gate circuits corresponding in number to the first plurality of pseudo-majority gate circuits, the second plurality of pseudo-majority-gate circuits each coupled to receive as inputs selected ones of the corrected outputs from the first plurality of pseudo-majority gate circuits as first, second, third, fourth, and fifth input signals, each of the second plurality of pseudo-majority gate circuits providing a second stage corrected output that takes on a first logic state when either the first and third input signals are logic high, or when either the third and fourth input signals are a logic high and the second input signal is a logic high and either the fourth or fifth input signals are a logic high, and the second plurality of pseudo-majority gate circuits providing a second stage corrected output that takes on a second state otherwise; and
  a decoding circuit adapted to receive as inputs the second stage corrected outputs from the second plurality of pseudo-majority gate circuits, the decoding circuit adapted to decode the inputs to provide a digitally encoded signal.

10. A converter as recited in clam 9, wherein the converter is fabricated in an integrated circuit.

11. A converter as recited in claim 9, where in the integrated circuit is a digital signal processor.

12. A converter for converting a signal from one form to another, comprising:
  a generator circuit adapted to receive an analog input signal and generate a plurality of binary output signals therefrom;
  at least one pseudo-majority-gate circuit coupled to receive as inputs selected ones of the binary output signals as first, second, third, fourth, and fifth inputs, the at least one pseudo majority gate circuit providing a corrected output that takes on a first logic state when either the first and third inputs are logic high, or when either the third and fourth inputs are a logic high and the second input is a logic high and either the fourth or fifth inputs are a logic high, and the at least one pseudo-majority gate circuit providing a corrected output that takes on a second state otherwise; and
  a decoding circuit adapted to receive as an input the corrected output from the at least one pseudo-majority gate circuit, the decoding circuit adapted to decode the input to provide a digitally encoded signal.

* * * * *